(12) United States Patent
Chan et al.

(10) Patent No.: US 11,095,094 B1
(45) Date of Patent: Aug. 17, 2021

(54) COMPACT WAVELENGTH-SWEPT SINGLE LONGITUDINAL MODE LASER FOR OPTICAL FREQUENCY DOMAIN REFLECTOMETRY

(71) Applicant: United States of America as Represented by the Administrator of NASA, Washington, DC (US)

(72) Inventors: Hon Man Chan, Canyon Country, CA (US); Allen R. Parker, Jr., Lancaster, CA (US)

(73) Assignee: U.S.A. as Represented by the Administrator of the National Aeronautics and Space Administration, Washington, DC (US)

(*) Notice: Subject to any disclaimer, the term of this patent is extended or adjusted under 35 U.S.C. 154(b) by 154 days.

(21) Appl. No.: 16/583,864

(22) Filed: Sep. 26, 2019

Related U.S. Application Data

(60) Provisional application No. 62/737,248, filed on Sep. 27, 2018.

(51) Int. Cl.
*H01S 3/10* (2006.01)
*H01S 5/06* (2006.01)
*H01S 5/062* (2006.01)
*H01S 5/024* (2006.01)
*H01S 5/02251* (2021.01)
*H01S 5/00* (2006.01)
*H01S 5/12* (2021.01)

(52) U.S. Cl.
CPC ........ *H01S 5/0617* (2013.01); *H01S 5/02251* (2021.01); *H01S 5/02415* (2013.01); *H01S 5/0623* (2013.01); *H01S 5/0078* (2013.01); *H01S 5/12* (2013.01)

(58) Field of Classification Search
CPC .............. H01S 5/0617; H01S 5/02251; H01S 5/02451; H01S 5/0623; H01S 5/0078; H01S 5/12
See application file for complete search history.

(56) References Cited

U.S. PATENT DOCUMENTS 7,813,648 B2 * 10/2010 Mahgerefteh .... H04B 10/25137
398/158
7,962,044 B2 * 6/2011 McCallion ........... G02B 6/4201
398/192

(Continued)

*Primary Examiner* — Kinam Park (57) ABSTRACT

A method and system for using a wavelength tunable semiconductor laser as an excitation source of a fiber optics sensing system (FOSS) based on a thermoelectric control of a laser sweep. A device can include an optical fiber; a set of fiber Bragg gratings disposed within the optical fiber; a single-frequency laser (SFL) operatively connected to the optical fiber; a thermoelectric cooler operatively connected to the SFL; a controller comprising a processor in communication with the thermoelectric cooler; and a nontransitory, computer-readable storage medium in communication with the processor. The nontransitory, computer-readable storage medium can store instructions that, when executed by the processor, cause the processor to perform operations including determining a strain value at a first fiber Bragg grating of the set of fiber Bragg gratings based on a second laser signal received at the device that is reflected from an interaction of a first laser signal with the first fiber Bragg grating.

19 Claims, 8 Drawing Sheets

(56) References Cited

U.S. PATENT DOCUMENTS

| | | | | |
|---|---|---|---|---|
| 9,784,674 B2* | 10/2017 | Miron | ............ | G01N 21/39 |
| 2014/0112361 A1* | 4/2014 | Njegovec | ............ | H01S 5/0612 |
| | | | | 372/34 |
| 2016/0261085 A1* | 9/2016 | Xu | ............ | H01S 3/06716 |

* cited by examiner

COMPACT WAVELENGTH-SWEPT SINGLE LONGITUDINAL MODE LASER FOR OPTICAL FREQUENCY DOMAIN REFLECTOMETRY

CROSS-REFERENCE TO RELATED APPLICATIONS

The present application derives priority from U.S. provisional patent application Ser. No. 62/737,248 filed on Sep. 27, 2018.

STATEMENT OF GOVERNMENT INTEREST

The invention described herein may be manufactured and used by or for the Government of the United States of America for governmental purposes without payment of any royalties thereon or therefor.

BACKGROUND

1. Field

The present disclosure relates to laser sources for optical fiber sensing systems, and more specifically, to a wavelength tunable semiconductor laser and method of use as the excitation source of a fiber optics sensing system (FOSS) based on optical frequency domain reflectometry (OFDR).

2. Description of the Background

There are many diverse engineering applications where determining or monitoring the shape of an article or structure is of paramount importance. The science of determining changes to the material and/or geometric properties of a structure is referred to as Structural Health Monitoring (SHM). Generally, SHM involves the observation of a structure over time using periodically sampled measurements from an array of sensors and the analysis of these measurements to determine the current state of structural health. There are many different sensors and sensing networks for accomplishing SHM tasks, but one that is rapidly gaining in popularity involves fiber optic sensing networks. Optical fiber sensors (OFS) are typically composed of numerous optical fibers and numerous Fiber Bragg gratings (FBGs) periodically-spaced along the length of each fiber. Each FBG creates a periodic variation of the optical refractive index in the core of its associated optical fiber, and when coupled to an interferometer, it becomes possible to detect changes in strain or temperature individually through change in its resonant wavelength (i.e., the wavelength at which each grating has its maximum reflectance).

With optical frequency domain reflectometry (OFDR) all the FBGs are supplied with laser light and the laser wavelength is scanned (where the scanning wavelength is inversely proportion to its frequency). The positions of the FBGs along the fiber are detected by interferometry, e.g., by measuring the beat frequency of individual FBG reflections relative to a reference reflection. A small but measurable difference in the time for light to travel from each FBG is observed using a Fast Fourier Transform (FFT) signal-processing method to convert the wavelength/time domain to the spatial/frequency domain so that the beating frequency for each FBG can be uniquely identified via distance.

However, since OFDR is based upon interferometry between FBGs relative to a unique reference length, the laser light must be lasing at a single well-defined frequency or a single longitudinal mode (SLM). Otherwise, if the laser light source contained multiple modes, the resulting FBG beat frequencies become a super-position of multiple frequencies caused by the multiple modes, and individual FBGs cannot be accurately defined at the Fourier domain. In short, the process of OFDR must contain a SLM-capable swept-frequency laser.

For OFDR systems with high sensing ranges, a continuously wavelength tunable laser is utilized to accompany the resonant wavelength shift of the fiber sensors due to environmental perturbation such as strain or temperature. There are several known methods of tuning.

With external-cavity lasers (ECLs) the beam wavelength is tuned mechanically by adjusting die laser cavity via a mechanical pivoting mirror ECLs can achieve relative narrow linewidth (in terms of MHz range) and are capable of lasing at single longitudinal mode with no mode-hopping during wavelength sweep. However, due to its complexity regarding the mechanical tuning, as well as its susceptibility to vibration and shock, ECLs are expensive, and not ideal for applications that have inherent environmental vibrations, such as in the aerospace sector.

Single-frequency lasers or SFLs are lasers emitting radiation in a single resonator mode. A distributed feedback (DFB) laser is a type of single frequency laser diode where the junction of the diode contains a periodically structured element or diffraction grating that acts like an optical filter resulting in a single, stable wavelength. That wavelength is set during manufacturing, for continuous waves typically between 760 nm and 3000 nm with high precision. DFB lasers are widely used in optical communication applications where a precise and stable wavelength is critical. It is well-known that tuning of a DFB can be achieved by modulating either the laser current or the chip temperature, but they are not designed to be tuned over any substantial range. There is only a quasi-linear relationship between temperature and wavelength. Indeed, typical DFB lasers are temperature-tunable over a range of just a few nanometers, and so they are typically not used in swept-wavelength applications such as OFDR. Nevertheless, they are relatively inexpensive, costing a tenth as much as external cavity lasers. Thus, it would be greatly advantageous to expand the tunability of DFB lasers for a variety of swept-wavelength applications and, in particular, to tune within a range of from 4 to 5 nm, and optimally +/−4.5 nm continuously.

For example, one of the reasons to develop the DFB laser as a lasing source for OFDR (and FOSS) is to demonstrate low-cost liquid level sensing in oil tanks, since sensing speed and sensing range are not the most important parameters in such applications. A usual setup for an external-cavity laser within a FOSS costs around $25 k, but a semiconductor-based DFB laser only costs around $1.5 k, which is 16× cheaper than the current system. A complete, low-cost FOSS employing a DFB laser can be produced for less than $2.5K, which can be utilized for accurate liquid level sensing, or any other FOSS sensing parameter that satisfied the laser parameter.

Thermoelectric (Peltier) devices are capable of maintaining precise temperature control of optoelectronic devices. What is needed is a DFB laser that is continuously-tuned via controlling the laser cavity's temperature through a thermal-electric cooler (TEC) feedback system.

SUMMARY

It is, therefore, an object of the present disclosure to provide a new, more accurate method and system for DFB laser tuning over an extended nanometer range for OFDR applications.

According to the present disclosure, the above-described and other objects are accomplished by a compact wavelength-swept single longitudinal mode laser for optical frequency domain reflectometry including a DFB laser that is continuously-tuned via controlling the laser cavity's temperature through a thermal-electric cooler (TEC) feedback system. An embodiment can include an optical fiber; a set of fiber Bragg gratings disposed within the optical fiber; a distributed feedback laser operatively connected to the optical fiber; a thermoelectric cooler operatively connected to the distributed feedback laser, a controller comprising a processor in communication with the thermoelectric cooler; and a nontransitory, computer-readable storage medium in communication with the processor. The nontransitory, computer-readable storage medium can store instructions that, when executed by the processor, cause the processor to perform operations including generating a laser signal, and continuously adjusting the laser signal over a range of wavelengths ranging from a lowest wavelength to a highest wavelength, and vice versa, by adjusting, through the thermoelectric cooler, a surface temperature of the distributed feedback laser. The instructions can further include determining a wavelength value at each of the set of fiber Bragg gratings based on a beat frequency of the FBG in response to the swept laser signal.

The compact wavelength-swept single longitudinal mode laser is suitable for an OFDR acquisition system capable of interrogating multiple fiber gratings. Continuous wavelength tuning of the laser generates a clean clock acquisition signal within an auxiliary interferometer, and simultaneously the laser interrogates multiple FBG gratings to be able produce a clean sensing interferogram, and a Fourier domain spectrograph shows the unique frequency (location) of each of the FBG gratings.

BRIEF DESCRIPTION OF THE DRAWINGS

Other objects, features, and advantages of the present disclosure will become more apparent from the following detailed description of the embodiments and certain modifications thereof when taken together with the accompanying drawings in which.

DETAILED DESCRIPTION OF THE PREFERRED EMBODIMENT

According to embodiments of the present disclosure, a more accurate method and system for wavelength-sweeping a single longitudinal mode DFB laser in a manner suitable for an optical frequency domain reflectometry (OFDR) acquisition system is herein disclosed. The DFB laser can be continuously and linearly swept over a sweep range by controlling the monolithic laser's case temperature through a thermoelectric feedback system. The disclosure includes an OFDR acquisition system with multiple fiber gratings based on a sensing interferometer in which continuous wavelength tuning of the DFB laser can generate a clean clock signal within the auxiliary interferometer, which can exist in multiple configurations such as Michelson or Mach Zehnder. Simultaneously, the DFB laser can interrogate multiple FBG gratings to be able produce a clean sensing signal from the sensing interferometer, and a Fourier domain spectrograph may show the unique frequency (location) of each of the FBGs. A wavelength meter is included in the optical network to ensure accuracy within each wavelength swept from the DFB laser tuning, which can also exist in multiple configurations.

Figure 1:
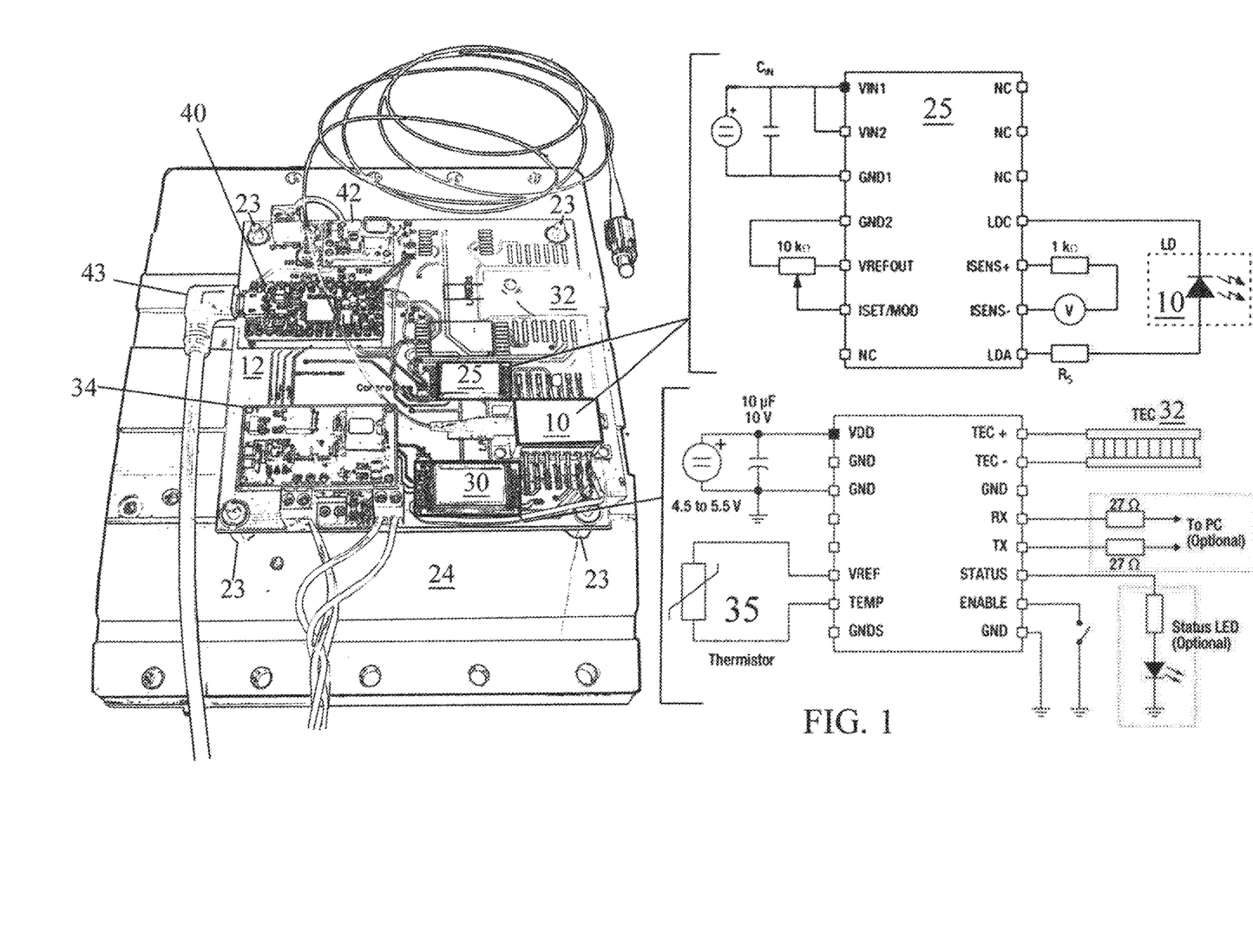
FIG. 1 is a front perspective view of the wavelength-swept single longitudinal mode DFB laser, according to an embodiment of the present disclosure.

FIG. 1 is a front perspective view of a wavelength-swept single longitudinal mode DFB laser 10 implemented on a single surface-mount printed circuit board (PCB) 12 according to embodiments of the present disclosure. The TEC function and circuitry may be internal to the DFB laser 10 or external. FIG. 1 illustrates an external embodiment in which PCB 12 is affixed to an aluminum heatsink 24 and spaced slightly therefrom on four pylons 23. Sandwiched between PCB 12 and the heatsink 24 is a thermoelectric cooler (TEC) 32. TEC 32 includes an array of one or more alternating n- and p-type semiconductors soldered between two ceramic plates. TEC 32 operates by the Peltier effect as a solid-state heat pump. When a DC electric current flows through the device, it can bring heat from one side to the other, so that one side gets cooler while the other gets hotter. The "hot" side in this instance is engaged toward the heat sink 24 so that it remains at an ambient or other more moderate temperature, while the cool side (facing) can be brought and maintained below the ambient temperature.

Wiring diagrams are shown in insets at right. TEC 32 is powered by a commercially-available TEC driver circuit 30 that receives temperature feedback from a thermistor 35 that abuts TEC 32. TEC driver circuit 30 receives power from a conventional DC/DC power converter module 34 configured for converting a source of direct current (DC) from wide-ranging input voltage level to a regulated 4.5-5.5 VDC. The thermistor 35 may be any suitable 10 kΩ thermistor. DFB laser 10 can generally include a monolithic, narrow linewidth semiconductor laser diode in the near infrared range without external cavity. The illustrated DFB laser 10 can be a commercially-available narrow-linewidth SLM semiconductor laser with a constant-length lasing cavity and laser linewidth of 100 kHz with a center wavelength of 1550 nm at a 25 degree case temperature. The DFB laser 10 can be mounted atop PCB 12 proximate a laser controller 25, preferably a constant current and low noise IC laser diode controller in a surface-mount package, a variety of which are commercially-available. The laser controller 25 is in turn controlled by a generic processor board 40, here an Adafruit™ ItsyBitsy M4 Express with an ATSAMD51 Cortex M4 processor running at 120 MHz, with on-board 512 KB Flash and 192 KB RAM and programmable with Python. A variety of other generic processors or programmable logic controllers would also suffice. A processor 40 can include a remote connection 43 such as a USB connector as shown.

As stated above the TEC function and circuitry inclusive of TEC driver circuit 30, thermistor 35 and TEC 32 may all be internal to the DFB laser 10. An example of a commercially available DFB laser 10 with internal TEC circuitry is an Apic™ Highly Linear, Direct Modulated DFB Laser Module.

The frequencies of DFB laser 10 can be maintained to a first order by controlling the case temperature of the DFB laser 10 vis a vis the underlying (or internal) TEC 32. Thermoelectric cooling is often used to regulate a constant temperature for DFB lasers in order to maintain a consistent output lasing wavelength. Here, however, the TEC 32 is used to sweep (continuously adjust) the laser signal over a range of wavelengths ranging from a lowest wavelength to a highest wavelength by adjusting, through current adjustments to TEC 32, a case temperature of the DFB laser 10.

The processor 40 can include software for operating the laser controller 25, controlling TEC controller 30, and/or for presenting a user interface via cable 43 to control the laser 10, and in this instance a dedicated software control module can be written in LabVIEW™, or any other suitable software, to control the laser case temperature.

Figure 2:
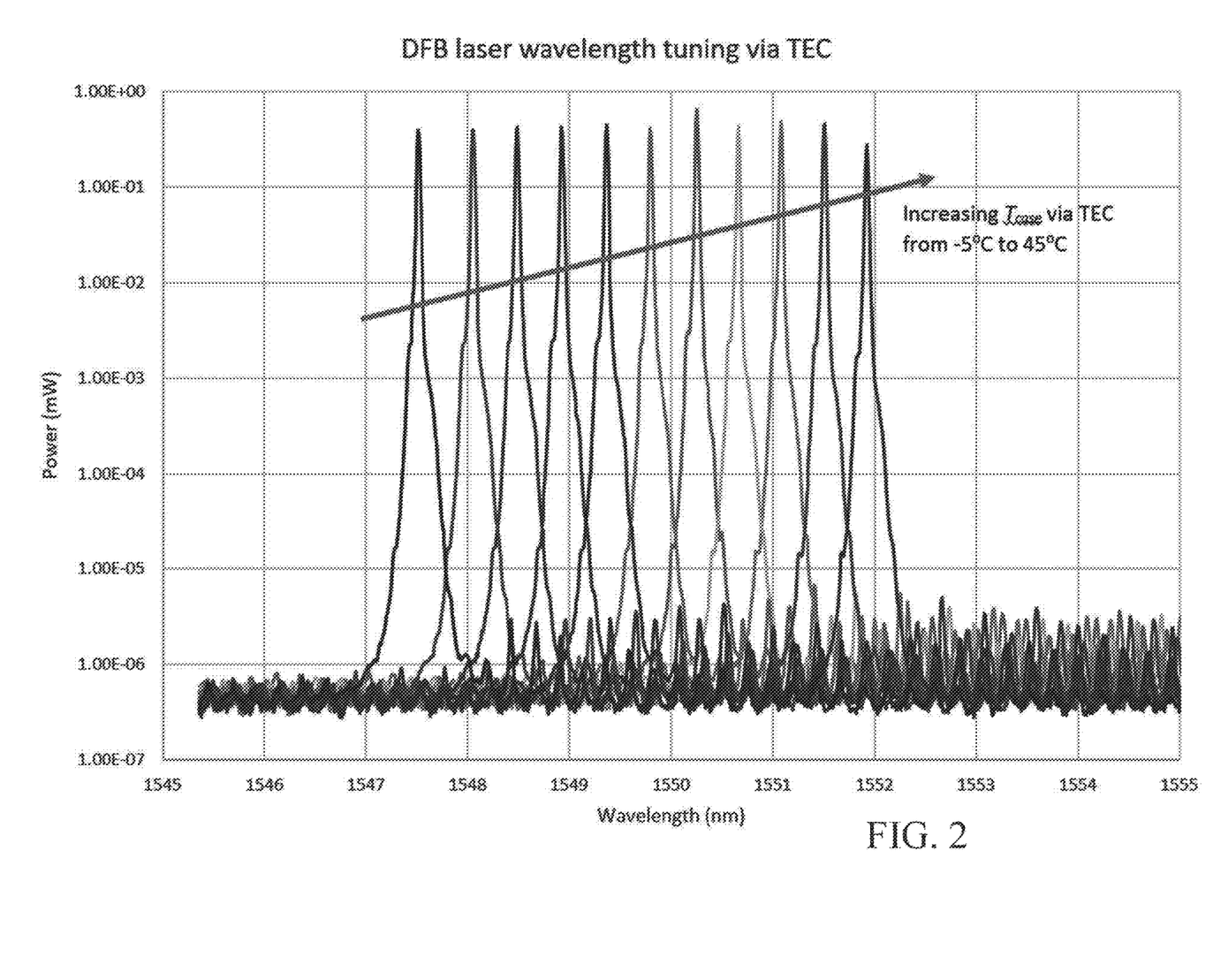
FIG. 2 shows the tuning characteristic of the DFB laser, according to embodiments of the present disclosure.

FIG. 2 shows the tuning characteristic of a DFB laser, according to the above-described embodiment. The output tuning characteristic of the DFB laser (nm) rises continuously as the case temperature (Tcase) is raised via TEC. The case set point temperature Tcase of the DFB laser is continually raised digitally at a relatively fast speed, but this is translated into substantially linear temperature tuning due to the delayed heat transfer properties of the DFB laser case. Thus, the user may set Temp Set point Low Limit=−5 deg C. and Temp Set point High Limit=45 deg and with Laser Diode Operating Mode at constant current and Case Mode at continuous sweep, the laser controller will drive current to TEC at the appropriate increasing level to effectuate linear tuning of the DFB laser over a 4.5 nm temperature range continuously in both directions, adhering to a prescribed tuning function described below in reference to FIG. 3.

Figure 3:
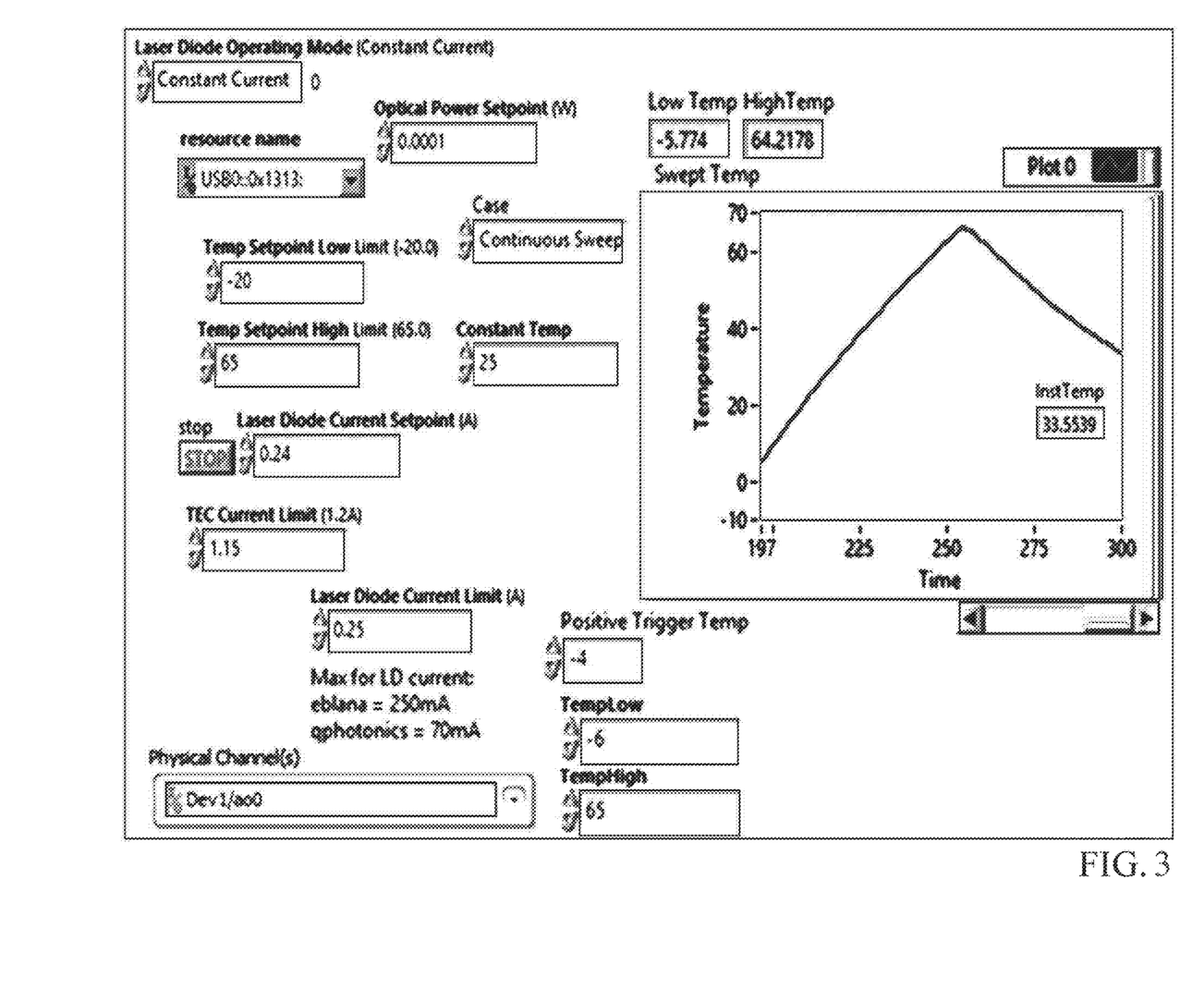
FIG. 3 is a graph of the DFB laser resonant wavelength (nm) as a function of temperature (deg. C.), according to embodiments of the present disclosure.

FIG. 3 is a graph of a DFB laser's resonant wavelength as a function of temperature (deg. C.) that again illustrates the linear nature of the DFB laser over a range of from 1547.5 nm to 1551.9 nm by linearly raising the case temperature Tcase of the DFB laser from −5 deg C. to 45 deg C., adhering to a tuning function Y (wavelength in nm)=0.0877×T (temp in deg. C.)+1548. Thus, it can be seen that the tuning function is OFDR suitable inasmuch as a linear rise in Tcase from −5 deg C. to 45 deg C. can provide a substantially linear rise in lasing wavelength from 1547.5 nm to 1551.9 nm. Thus, the present disclosure generally allows DFB laser to be tuned up or down within a 4.5 nm wavelength range continuously and linearly by temperature tuning within a 50 degree C. temperature range.

Figure 4:
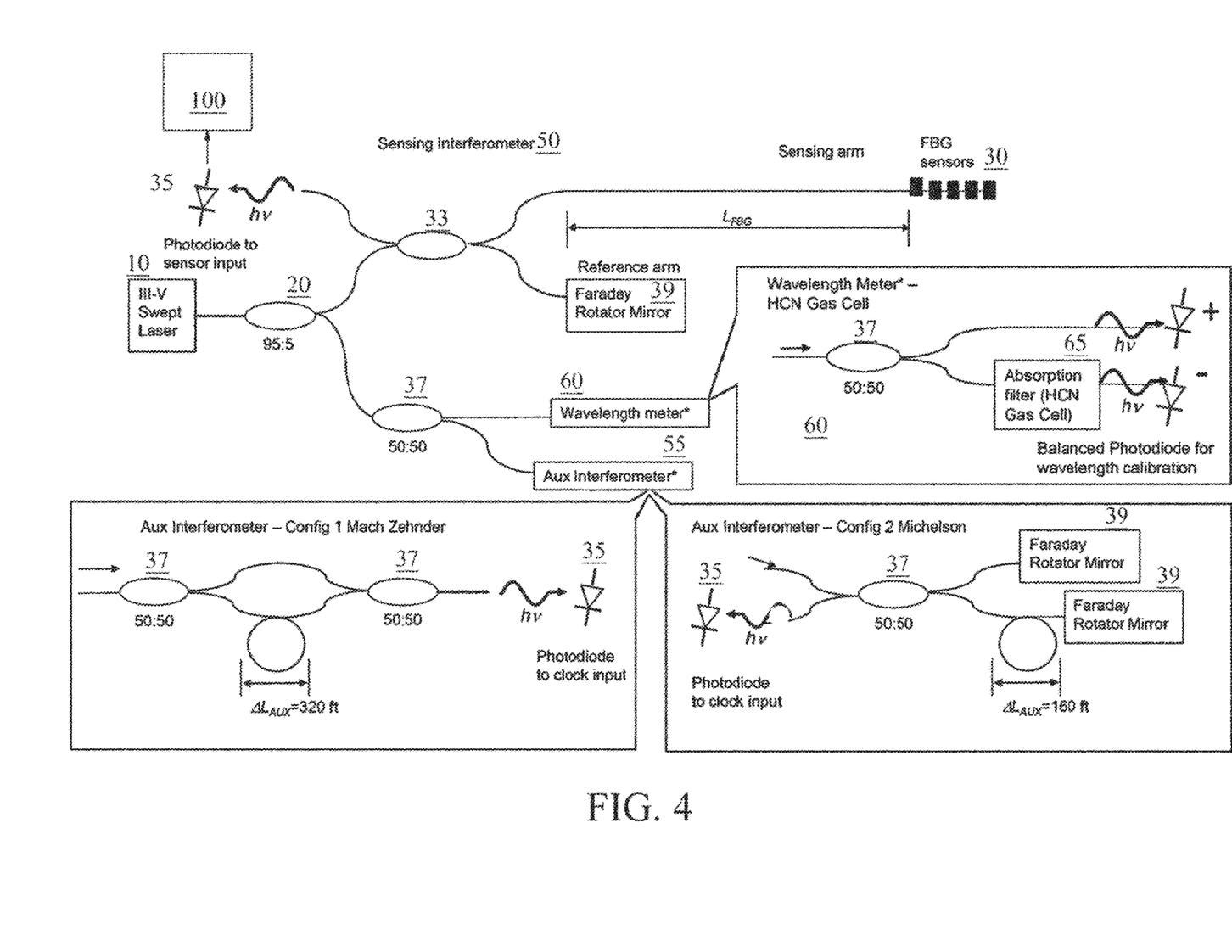
FIG. 4 is a schematic diagram illustrating the wavelength-swept single longitudinal mode DFB laser incorporated in a fiber optic sensing system (FOSS), according to embodiments of the present disclosure.

FIG. 4 is a schematic diagram illustrating the wavelength-swept single longitudinal mode DFB laser 10 described above incorporated in a FOSS system, according to embodiments of the present disclosure. The optical configuration can include two interferometers: an auxiliary (AUX) interferometer 55 (bottom) which may be used to provide external clock signal to the acquisition system and a main interferometer 50 (top) which may be used to detect changes in wavelength.

The DFB laser 10 output can be split into the sensing interferometer 50 and the auxiliary interferometer 55 via a 95:5 fiber coupler 20. The wavelength-swept single longitudinal mode DFB laser 10 can interrogate the TEC controllers 30 using optical frequency domain reflectometry, which can detect subtle shifts in the wavelength reflected by the sensors 30 in response to strain or temperature changes on the fibers. Each sensor 30 may be continuously queried and the reflections are multiplexed by a multiplexer (MUX) 33 and then captured on an optical detector 35. The output of the detector 35 can be sent to an attached oscilloscope or spectrum analyzer or converted to a digital signal by A/D and sent to a computing device 100 for analysis where analytic operations are executed to determine the strain or temperature magnitude at each sensor 30.

As seen in the bottom insets of FIG. 4, the auxiliary interferometer 55 can be, for example, a Mach Zehnder interferometer (left) with a constant beat length difference of 160 feet via two 50:50 fiber couplers 37. Alternatively, the auxiliary interferometer 55 can be a Michelson interferometer (right) with two 50:50 fiber couplers 37 that split the light into two different arms. Rotating Faraday mirrors 39 (each a Faraday rotator followed by a mirror) can be used as the reflectors to eliminate the effects of birefringence on the polarization of light.

The system clock can depend on coherence time, which may depend on the length difference of the auxiliary interferometer 55, as well as the sweep rate of the laser 10. Given the sweep parameters of FIG. 3, a sweep rate of 1.14 nm/s may be suitable. Optical detector 35 may be a photodiode designed to collect the signal and send it to either a dedicated computing device 100 (via one or more analog or digital signals) and/or attached oscilloscope or spectrum analyzer for analysis. Given the foregoing parameters the calculated clocking frequency may be, for example, 34 kHz and agree with the measured clock.

The calibrated wavelength meter 60 may be a commercially-available wavelength meter calibrated using a self-referenced gas reference cell. The gas reference cell may comprise a cylindrical container (cell) containing a high purity molecular compound or atomic element. Gas reference cell serves as an absolute wavelength calibration source because it only absorbs light at one specific wavelength that corresponds to the allowed transitions between energy levels of the material inside the reference cell. For example a Hydrogen Cyanide ($H_{13}C_{14}N$) reference cell will provide a suitable absorption reference for wavelengths between 1525 nm-1565 nm. The wavelength meter 60 can be in data communication with a computing system 100 and a processor. Preferably, data streaming from the wavelength meter 60 to the computing system 100 can be triggered externally by the processor for synchronization.

As discussed above in regard to FIG. 1, the laser controller 25 is in turn controlled by the processor 40. The sensor 35 of FIG. 4 can be in communication with a different computing device, which can be a separate suitable computer including a processor, memory (e.g. RAM), a bus which couples the processor and the memory, a mass storage device (e.g. a magnetic hard disk or an optical storage disk) coupled to the processor and the memory through an I/O controller, plus software for accumulating, indexing, and storing measured strain, temperature and/or wavelength values in a "strain matrix" The computing device described herein may be part of a larger data processing system or network that includes one or more of a processor, memory, input/output circuitry, and peripheral devices. However, the computing device can be in wired or wireless communication with the processor (for example, e.g., via USB connection) so as to implement a computerized feedback loop. This way, die procedure for determining a measurement value at an FBG 30, according to embodiments of the present disclosure may account for the parameters set by the processor. One skilled in the art will also understand that the computing device and the processor may be one and the same device.

The above-described system architecture is capable of measuring the strain at each FBG sensor 30 as the DFB laser 10 sweeps its output over the predetermined wavelength range into the auxiliary interferometer 55 and the sensing interferometer 50 to produce a plurality of reference interference fringes and measurement interference fringes, respectively. The fringes from the auxiliary interferometer 55 are digitized at the computing device 100 in the same manner as the measurement fringes. After being digitized, the computing device 100 can run a computer algorithm to determine the phase of the signal at every point in the data set and, from this phase, the change in wavelength of the tunable laser can be determined.

Figure 5:
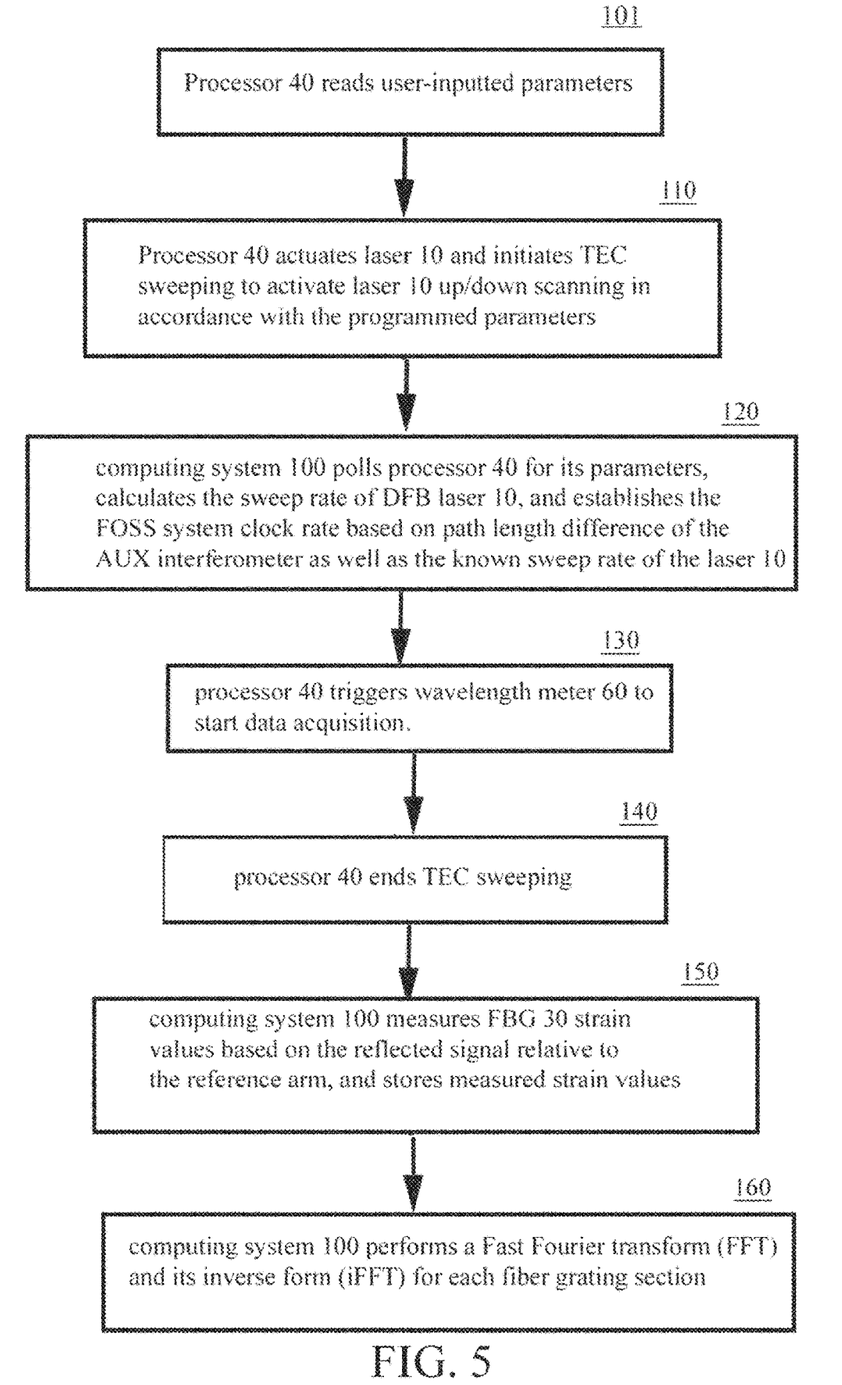
FIG. 5 is a block diagram illustrating an exemplary process for obtaining wavelength from the temperature tuning laser, according to embodiments of the present disclosure.

An example procedure for determining a strain value at an FBG 30, according to embodiments of the present disclosure is shown in FIG. 5.

FIG. 5 is a block diagram illustrating an exemplary process for obtaining strain from the temperature tuning laser according to the disclosure.

First, at step 101, processor 40, can read the user-inputted Temp Set point (3), Low Limit (4); High Limit (5), Constant Temp (6), and TEC Current Limit (8), and execute operations to calculate the total sweep time, and from that, the sweep rate (for example, 1.14 nm/s) of the DFB laser 10.

Second, at step 110 the processor 40 actuates the DFB laser 10 and initiates TEC sweeping to activate the laser 10 up/down scanning in accordance with the programmed parameters of step 101. The processor 40 can adjust a surface temperature of the DFB laser 10 to generate a laser signal at a specific user-inputted Temp Set point (3). Then the processor 40 can adjust the surface temperature of the DFB laser 10 up or down to generate a continuously swept laser signal between the Low Limit (4) and High Limit (5) over the calculated the sweep time. For example, the controller can increase, decrease, or reverse current flow through TEC to induce a temperature change in a surface of the TEC that interfaces with the surface of the DFB laser 10. The TEC surface temperature change may then correspondingly lower the surface temperature of the DFB laser 10 such that the wavelength of the laser signal generated by the DFB laser 10 is swept (increased or decreased). The DFB laser 10 is connected to the FOSS system as shown in FIG. 4, in which a sensing fiber may be disposed along a span of a structure to be monitored. The laser signal may interact with a FBG 30 located within the optical fiber, and when the polling wavelength matches the resonant beat frequency of that FBG 30 a portion of the laser signal can be reflected back through first optical fiber to a photodiode or other component of the FOSS. The computing system 100 may then perform signal processing operations and other operations related to OFDR to process the reflected signal.

Simultaneous with step 110, at step 120, the computing system 100 polls processor 40 for its parameters, calculates the sweep rate of the DFB laser 10, and establishes the FOSS system clock rate based on path length difference of the AUX interferometer as well as the known sweep rate of the DFB laser 10.

At step 130, the processor 40 triggers a wavelength meter 60 to start data acquisition. The sensing interferometer 50 is used for causing beat frequency interference to occur on the frequency-swept laser light entering the sensing interferometer 50 to generate a first beat frequency signal. The auxiliary interferometer 55 causes beat frequency interference to occur on frequency-swept laser light entering the auxiliary interferometer 55 to generate a second beat frequency signal. The second beat frequency signal is converted to an external clock for high-speed data acquisition of the computing system 100. Thus the computing system 100 samples the first beat frequency signal at the external clock interval.

Fourth, at step 140, the processor 40 ends TEC sweeping when thermistor 35 voltage reaches the High Limit (5).

Fifth, at step 150, the computing system 100 measures individual FBG 30 strain values based on the reflected signal relative to the reference arm, and stores measured strain, temperature and/or wavelength values in a "strain matrix."

Sixth, the computing system 100 may perform further operations to determine an actual strain in the structure being monitored, such as estimating a strain at each FBG sensor 30, mapping the strain at each sensor a finite element (FEM) model and computing structural strain therefrom. There are a variety of suitable techniques available for strain estimation including integration methods, strain-mode shape, inverse FEM and photogrammetry. The computing system 100 can perform a Fast Fourier transform (FFT) and its inverse form (iFFT) for each fiber grating section.

Figure 6:
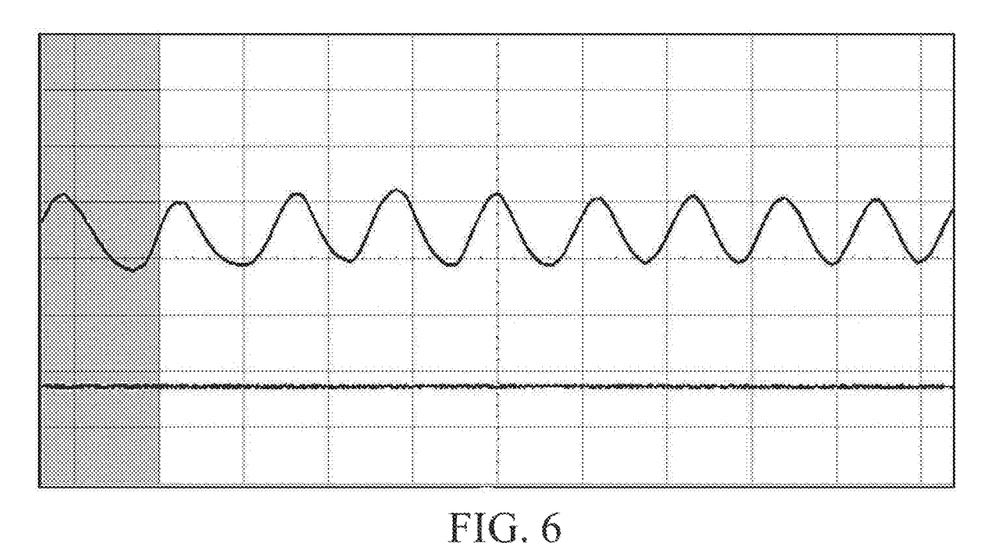
FIG. 6 is an oscilloscope screen print showing the clock signal obtained through the auxiliary interferometer of FIG. 4, according to embodiments of the present disclosure.

FIG. 6 is an oscilloscope screen print showing the clock signal obtained through the auxiliary interferometer shown in FIG. 4, according to embodiments of the present disclosure. The system clock can be determined by the swept speed of the DFB laser multiplied by the length difference of the interferometer ($L_{aux}$). The insert shows an example of the system clock throughout the whole laser sweep.

Figure 7:
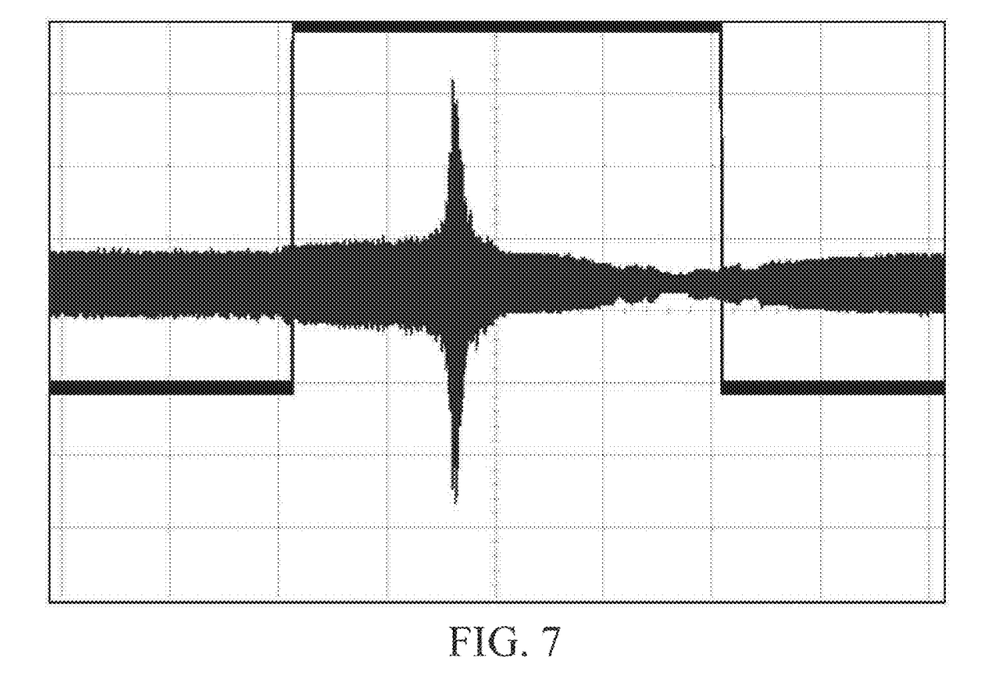
FIG. 7 is an oscilloscope screen print showing the sensor interferogram generated with respect to the sensor of FIG. 4 with the center wavelength at 1550 nm, according to embodiments of the present disclosure.

FIG. 7 is an oscilloscope screen print showing the sensor interferogram generated with respect to the sensor 35 of FIG. 4 with the center wavelength at 1550 nm, according to embodiments of the present disclosure. As shown, the DFB laser 10 can be tuned from 1548 to 1551 nm, which can be within the center wavelength of the FBG sensors 30.

Figure 8:
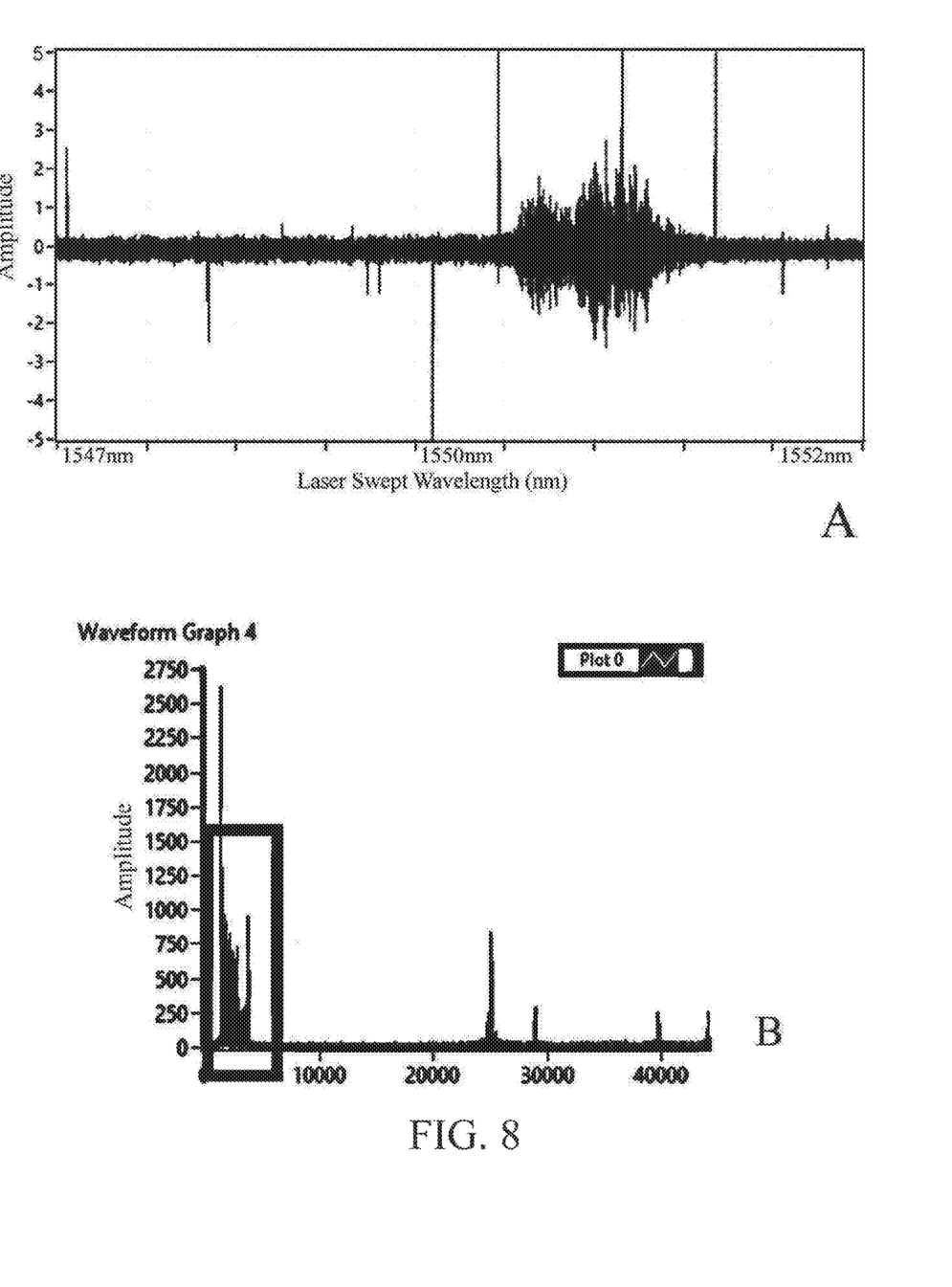
FIG. 8 is shows the raw interferogram at (A), as well as the Fourier Domain generation from the interferogram at (B), and zoom-in view of the Fourier Domain at (C), according to embodiments of the present disclosure.

FIG. 8 shows the raw interferogram at (A) attained by post process software LabVIEW® to obtain the interferogram, as well as the Fourier Domain of the sensors 30 generation from the interferogram at (B) of the sensors highlighted by the box at bottom left.

Figure 9:
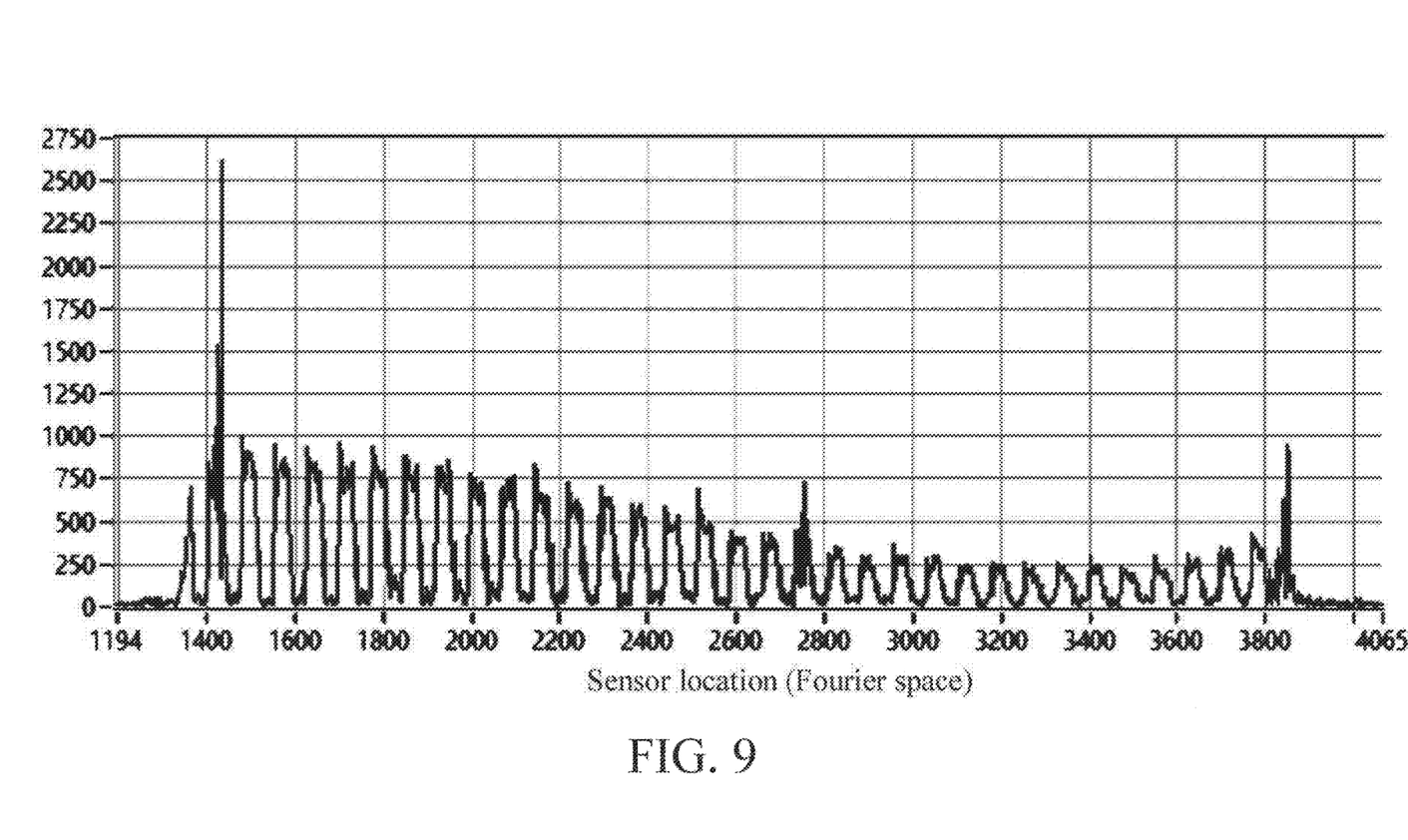
FIG. 9 zooms into the Fourier domain and frequency detail information of each of the fiber gratings in the FOSS, which can include, for example ½" FBGs and ½" spacing between each FBG, according to embodiments of the present disclosure.

FIG. 9 zooms into the Fourier Domain and frequency detail information of each of the fiber gratings in the FOSS, which can include, for example ½" FBGs and ½" spacing between each FBG.

Clean Fourier Domain spectrometer results demonstrate that the DFB laser 10 can replace typical external cavity lasers in OFDR sensing, with semiconductor-based devices with no moving parts. Thus temperature-tuned DFB lasers 10 employed as a lasing sources for OFDR sensing, achieve the benefits of external cavity lasers, with less complexity and cost.

Although the operations described in this disclosure may be described in a specific order, other operations may be performed in between described operations, and/or other orders of operations may be performed. Operations described herein may also be adjusted so that they occur at different times or described operations may be distributed in a system which allows the occurrence of the processing operations at various intervals associated with the processing, as long as the processing of the overlay operations are performed in a desired way. In addition, structural embodiments of the foregoing disclosure can be implemented in and used with a variety of components and network architectures.

The foregoing disclosure, for purpose of explanation, has been described with reference to specific embodiments. The illustrative discussions above are not intended to be exhaustive or to limit embodiments of the disclosure to the precise forms disclosed. Many modifications and variations are possible in view of the teachings of this disclosure. The embodiments were chosen and described in order to explain the principles of embodiments of the disclosure and their practical applications, and to thereby enable others skilled in the art to utilize those embodiments as well as various embodiments with various modifications as may be suited to the particular use contemplated.

As used herein, the terms "approximately" and "about" generally refer to a deviance of within 10% of the indicated number or range of numbers.

Having now fully set forth the preferred embodiment and certain modifications of the concept underlying the present disclosure, various other embodiments as well as certain variations and modifications of the embodiments herein shown and described will obviously occur to those skilled in the art upon becoming familiar with the underlying concept. It is to be understood, therefore, that the disclosure may be practiced otherwise than as specifically set forth in the appended claims.

What is claimed is:

1. A device, comprising:
   an optical fiber;
   a plurality of fiber Bragg gratings disposed within the optical fiber;
   an optical sensor for sensing a resonant frequency of each of the plurality of fiber Bragg gratings disposed within the optical fiber;
   a single frequency laser (SFL) operatively connected to the optical fiber;
   a thermoelectric cooler operatively connected to the SFL;
   a controller comprising,
      a processor in communication with the thermoelectric cooler; and
      a nontransitory, computer-readable storage medium in communication with the processor and one or more storing instructions that, when executed by the processor, cause the processor to perform operations comprising the following steps,
         generating a first laser signal at a first wavelength,
         emitting, by the SFL, the first laser signal through the optical fiber, and
         continuously varying the first laser signal between the first wavelength and a second wavelength by linearly adjusting, through the thermoelectric cooler, a surface temperature of the SFL;
      a computer in communication with the optical fiber, the computer comprising a nontransitory, computer-readable storage media storing instructions that, when executed by the computer, cause the computer to measure a beat frequency at each of the plurality of fiber Bragg gratings.

2. The device of claim 1, wherein the surface temperature is adjusted from below 0 degrees Celsius to above 40 degrees Celsius.

3. The device of claim 1, wherein the step of varying the first laser signal between the first wavelength and the second wavelength comprises linearly adjusting over a range of at least 4.5 nanometers by adjusting the surface temperature of the SFL over a range of at least 50 degrees Celsius.

4. The device of claim 1, wherein the SFL comprises a sensor interferometer and an auxiliary interferometer.

5. A method of sweeping a single frequency laser (SFL) that has no external cavity, comprising:
   selecting a wavelength sweep range for the SFL laser;
   selecting a sweep time for the SFL laser;
   selecting a rate of temperature change over time for temperature-tuning the wavelength of a laser beam to be emitted from the SFL laser;
   emitting the laser beam from the SFL laser; and
   sweeping the laser beam from the SFL laser by adjusting a thermoelectric cooler at the selected rate of change over time, thereby adjusting a case temperature of the SFL laser.

6. The method of claim 5, further comprising:
   detecting a characteristic of the SFL laser;
   in response to the detected characteristic, determining a change to a parameter of operation of the SFL laser that maintains a linear wavelength sweep; and
   adjusting the operation of the SFL laser based on the determined change to the parameter.

7. The method of claim 6, wherein the parameter comprises a temperature of the SFL laser, a polarity of the SFL laser, and a current provided to the SFL laser.

8. The method of claim 6, wherein the selected rate of temperature change comprises a linear rate of change, a quadratic rate of change, a cubic rate of change, an exponential rate of change, a trigonometric rate of change, and a logarithmic rate of change.

9. The method of claim 8, wherein:
   the selected rate of temperature change comprises a linear rate of change;
   the detected characteristic of the SFL laser device comprises a change in case temperature;
   the determined change in the parameter comprises a change in the current provided to the SFL laser.

10. The method of claim 5, wherein the step of selecting a wavelength sweep range from approximately 1548 nanometers to approximately 1552 nanometers.

11. The method of claim 10, wherein the step of automatically sweeping the laser beam from the SFL laser by adjusting a thermoelectric cooler in communication with the computing device at the selected rate of change over time, comprises adjusting the temperature from approximately −5 degrees Celsius to approximately 45 degrees Celsius.

12. The method of claim 11, wherein the step of emitting the laser beam comprises emitting the laser beam through an optical fiber of an optical frequency domain reflectometry system and determining a strain value at a fiber Bragg grating disposed within the optical fiber.

13. The method of claim 6, further comprising:
   presenting an interface to a user for accepting the selection of the rate of change.

14. A system, comprising:
   a single frequency laser (SFL) device;
   a thermoelectric cooler operatively connected to the single mode SFL device;
   a controller in communication with the thermoelectric cooler; and
   a nontransitory, computer-readable storage medium in communication with a processor and storing instructions that cause the processor to perform operations comprising the steps of, inputting a wavelength sweep range and a wavelength sweep time for a laser beam to be emitted from the SFL device, emitting the laser beam from the SFL device, and sweeping a wavelength of the laser beam emitted from the SFL device over the wavelength sweep range and the wavelength sweep time by adjusting a temperature of the SFL device.

15. The system of claim 14, further comprising an optical fiber having a plurality of fiber Bragg gratings disposed within the optical fiber.

16. The system of claim 15, further comprising an optical sensor for sensing a resonant frequency of each of the plurality of fiber Bragg gratings disposed within the optical fiber.

17. The system of claim 16, further comprising a computer in communication with the controller.

18. The system of claim 14, wherein the wavelength sweep range comprises approximately 1548 nanometers to approximately 1552 nanometers.

19. The system of claim 18, wherein the wavelength sweep range is swept by adjusting the thermoelectric cooler over a temperature range of from approximately −5 degrees Celsius to approximately 45 degrees Celsius.

* * * * *